US008786993B2

(12) United States Patent
Rabayrol

(10) Patent No.: US 8,786,993 B2
(45) Date of Patent: Jul. 22, 2014

(54) CABLING OF AN AIRCRAFT CIRCUIT BREAKER PANEL

(71) Applicant: Airbus Operations SAS, Toulouse (FR)

(72) Inventor: Christian Rabayrol, Toulouse (FR)

(73) Assignee: Airbus Operations SAS, Tolouse (FR)

( * ) Notice: Subject to any disclaimer, the term of this patent is extended or adjusted under 35 U.S.C. 154(b) by 0 days.

(21) Appl. No.: 13/687,609

(22) Filed: Nov. 28, 2012

(65) Prior Publication Data
US 2013/0135779 A1 May 30, 2013

(30) Foreign Application Priority Data
Nov. 30, 2011 (FR) ...................................... 11 60961

(51) Int. Cl.
H01H 73/06 (2006.01)
(52) U.S. Cl.
USPC .......................................................... 361/115
(58) Field of Classification Search
USPC .......................................................... 361/115
See application file for complete search history.

(56) References Cited

U.S. PATENT DOCUMENTS

| 3,346,777 | A | 10/1967 | Leonard |
| 8,488,302 | B2 * | 7/2013 | Mills et al. ..................... 361/636 |
| 2003/0052220 | A1 | 3/2003 | Goldberg |
| 2004/0228071 | A1 | 11/2004 | Healy |
| 2012/0262848 | A1 * | 10/2012 | Mills et al. ..................... 361/636 |
| 2013/0135779 | A1 * | 5/2013 | Rabayrol ........................ 361/81 |

FOREIGN PATENT DOCUMENTS

FR 2 786 326 5/2000

OTHER PUBLICATIONS

French Search Report dated Jul. 20, 2012, with English translation.

* cited by examiner

Primary Examiner — Ronald W Leja
(74) Attorney, Agent, or Firm — Dickinson Wright PLLC

(57) ABSTRACT

A distribution panel aboard an aircraft includes sites intended for the installation of functional electrical circuit breakers of which at least one of the sites is not occupied by a functional circuit breaker. The functional circuit breakers are wired up to a monitoring system via monitoring cabling so as to monitor a state of the circuit breakers. The at least one site not occupied by a functional circuit breaker is occupied by a nonfunctional circuit breaker, termed a false circuit breaker. The false circuit breaker is able to deliver a state signal and is wired up to the monitoring system by the monitoring cabling in a manner identical to that of a functional circuit breaker.

8 Claims, 2 Drawing Sheets

US 8,786,993 B2

CABLING OF AN AIRCRAFT CIRCUIT BREAKER PANEL

CROSS REFERENCE TO RELATED APPLICATION

This application is entitled to and claims the benefit of French Application No. FR 2011 60961 filed Nov. 30, 2012, the disclosure of which including the specification, drawings and abstract is incorporated herein by reference in its entirety.

FIELD

The present invention relates to an electrical distribution panel aboard an aircraft comprising circuit breakers monitored by means of cabling for monitoring the state of the said circuit breakers. More particularly, the invention relates to a distribution panel comprising is standardized monitoring cabling allowing the addition or the removal, subsequently, of circuit breakers without requiring modification of the said monitoring cabling.

BACKGROUND

Aboard modern aircraft, when an electrical device is installed, be it for example a computer or in general any electrical consumer, a circuit breaker is used to protect its electrical circuit against overloads or short-circuits.

The circuit breakers, which may exceed several hundred in number, are arranged in matrix fashion, in rows and columns, on distribution panels 10, as illustrated in FIG. 1, the said panels being installed mainly in the flight deck or the holds.

When an aircraft is in service or if its definition at an advanced stage of its manufacture is altered and additional electrical devices have to be installed, it is necessary to add circuit breakers.

The panels are therefore designed, when the aircraft is put into service, to be able to receive additional circuit breakers. The said panels thus comprise free sites for receiving these circuit breakers when electrical devices are added.

Furthermore, having regard to the large number of circuit breakers and the non-accessibility of certain distribution panels in the course of the flight of the aircraft, such as those situated in the holds of the aircraft, a monitoring system is used to permanently check the state of each circuit breaker. Upon a change of state of a circuit breaker, the monitoring system informs the other systems and the pilot of the status, and in particular of the changes of states, of the circuit breakers, which act so as to take into account the consequences of this change of state.

To carry out this state monitoring of the circuit breakers, a cabling of the circuit breakers according to rows and columns is commonly used in such a way that reading an item of information according to a row and a column gives the state of the circuit breaker which is positioned at the intersection of the said row and the said column.

When a modification has to be performed, for example, the addition or the removal of an electrical device, a prevailing solution consists in adding or removing the associated circuit breaker or circuit breakers on the distribution panel. Each modification also entails a modification of the cables for monitoring the state of the circuit breakers. Thus, when a circuit breaker is added or removed, the associated monitoring cables are likewise added, removed or replaced. These various modifications give rise to very different cabling between aircraft, which is perpetually being altered and is relatively expensive as regards the time required to install or deinstall the monitoring cables, depending on the presence or otherwise of circuit breakers.

SUMMARY

The present invention proposes a distribution panel that is standardized at the level of the matrix cabling for monitoring the circuit breakers which does not require any modification of the monitoring cabling when adding or removing circuit breakers.

According to the invention, a distribution panel aboard an aircraft comprises sites intended for the installation of functional electrical circuit breakers of which at least one of the sites is not occupied by a functional circuit breaker, in which certain functional circuit breakers are wired up to a monitoring system by means of monitoring cabling so as to monitor a state of the said circuit breakers, and the at least one site not occupied by a functional circuit breaker is occupied by a nonfunctional circuit breaker, termed a false circuit breaker, the said false circuit breaker being able to deliver a state signal and being wired up to the monitoring system by the monitoring cabling in a manner identical to that of a functional circuit breaker.

In order to guarantee interchangeability between the functional circuit breakers and the false circuit breakers without damaging the monitoring cables, the false circuit breaker comprises terminals, for receiving the said monitoring cabling, and arranged geometrically in a manner substantially identical to the terminals of a functional circuit breaker.

In one embodiment, the state signal delivered by the false circuit breaker corresponds to one of the state signals delivered by the functional circuit breaker. The state signal delivered by the false circuit breaker may be either enabled or disabled.

In another embodiment, the state signal delivered by the false circuit breaker corresponds to a different signal from the signals that may be delivered by the functional circuit breaker.

Advantageously, the false circuit breaker comprises a selector for determining the state signal delivered by the said false circuit breaker. The selector may be for example an on/off switch with two states, enabled or disabled.

Preferably, the monitoring cables are defined, at the level of the functional circuit breaker, by an identification number making it possible to associate the functional circuit breaker with the device with which it is associated, and are identified, at the level of the false circuit breaker, not associated with a device, by a provisional identification number. In an exemplary embodiment, the said provisional identification number is defined by a row-wise and column-wise position of the false circuit breaker.

BRIEF DESCRIPTION OF THE DRAWINGS

The detailed description of the circuit breaker panel is given with reference to the figures which represent.

DETAILED DESCRIPTION

Figure 2:
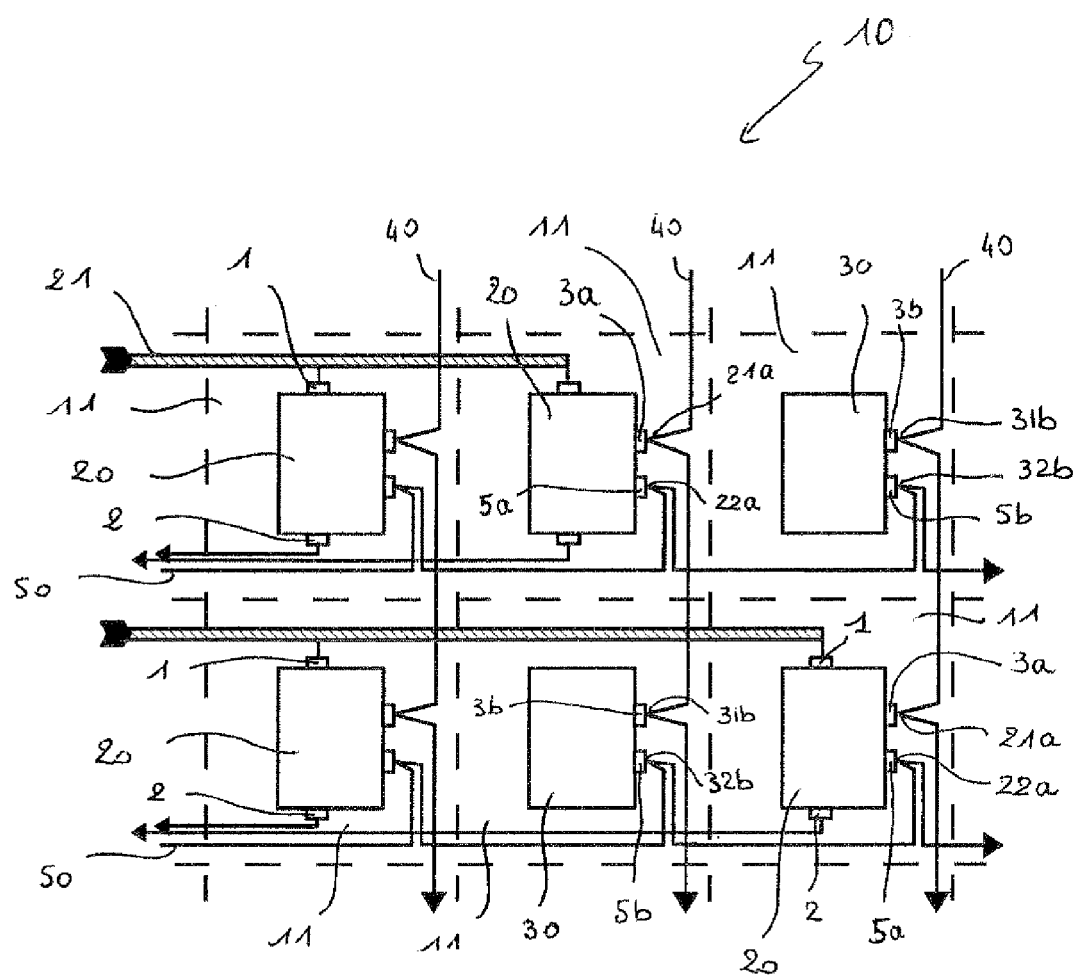
FIG. 2, a schematic view of the cabling of a part of the rear face of a distribution panel in accordance with the invention.

An electrical distribution panel 10 in an aircraft in accordance with the invention, as illustrated in FIG. 2, comprises sites 11, positioned in a matrix manner in rows and columns, able to receive circuit breakers. Some of the said sites 11 comprise functional circuit breakers 20 for protecting the electrical devices (not represented) with which they are associated.

Furthermore, the said panel comprises, at at least one site 11, a nonfunctional element, termed a false circuit breaker 30, when the said site is not occupied by a functional circuit breaker 20.

The distribution panel 10 is advantageously coupled up to all the sites 11 designed to receive the circuit breakers.

A power supply cabling 21 for the device is wired up to corresponding functional circuit breakers 20. The said power supply cabling 21 is linked to each functional circuit breaker 20, for example at the level of the terminals 1 and 2, in the case of a circuit comprising only one power supply cable, as illustrated in FIG. 2. Circuits comprising several power supply cables, as for example a three-phase circuit (not represented), can also be associated with a circuit breaker 20.

The functional circuit breakers 20 and the false circuit breakers 30 are wired up by means of cables 40, 50 termed monitoring cables, to a system (not represented) for monitoring the state of the circuit breakers.

This monitoring cabling is not constraining to effect as regards the choice of the monitoring cables 40, 50 since all the monitoring cables are identical independently of the rating of the circuit breakers installed. On principle, a circuit breaker's monitoring cables intended to gather a state signal of the said circuit breaker do not depend, as regards their characteristics, in particular the cross-section, on the type of circuit breaker installed, in particular the rating. Consequently, the monitoring cables 40, 50 may be installed without knowing the present or future characteristics of the circuit breaker.

The monitoring cables 40, 50 are organized row-wise and column-wise, in accordance with the arrangement of the circuit breakers.

The monitoring cabling is effected in such a way that at one and the same time the said cabling links terminals 3a, 5a of the functional circuit breakers 20 and terminals 3b, 5b of the false circuit breakers 30.

More precisely, the monitoring cable 40 links together electrically all those terminals 3a of the circuit breakers 20 and 3b of the false circuit breakers 30 that are situated in one and the same column. Advantageously, the said terminals are linked in series.

In a similar manner, the cabling 50 links together electrically all those terminals 5a of the circuit breakers 20 and 5b of the false circuit breakers 30 that are situated in one and the same row. Advantageously, the said terminals are linked in series.

Each cable 40, 50 is linked at one of these ends, generally by means for example, of a multiplexer or of a concentrator, to the monitoring system. The said monitoring system is thus able to analyse the state signal successively at the terminals of the functional circuit breaker 20 or false circuit breaker 30 at each row-column intersection and to deduce therefrom a state of the said functional circuit breaker 20 or false circuit breaker 30 at the said intersection.

The installation of the power supply cabling 21 for a device on the false circuit breakers is possible but turns out to be penalizing because of the weight and dimensions of the said power supply cabling even though the said cables are not used. Furthermore, the choice of the necessary cross-section of the power supply cabling 21 is arbitrary if the device having to be powered is not known.

In one embodiment, the terminals 3a, 5a of a functional circuit is breaker 20 correspond to the terminals of a switching means, for example an on/off switch, which is in an enabled state, for example a closed on/off switch, for a first state of the circuit breaker and in a disabled state, for example an open on/off switch, for a second state of the circuit breaker. Consequently, when the circuit breaker changes state, the switching means change enabled or disabled condition.

The false circuit breakers 30 not being associated with an electrical device, the said false circuit breakers deliver, at the terminals 3b, 5b wired up to the monitoring system, a constant state signal corresponding to an arbitrary choice. In a particular embodiment, the false circuit breaker 30 comprises, at the level of the terminals 3b and 5b, a selector making it possible to choose the state of the signal returned by the false circuit breaker, for example enabled or disabled, so as to apply the designer's arbitrary choice.

In another embodiment, the predefined state of the false circuit breaker 30 corresponds to a third state. This third state, which does not correspond to any state, enabled or disabled, of a functional circuit breaker 20 allows the electronics of the monitoring system to identify the presence of the false circuit breaker 30.

Advantageously, to guarantee interchangeability between the functional circuit breakers 20 and the false circuit breakers 30 without running the risk of damaging the electrical monitoring cables 40, 50, the false circuit breaker 30 comprises a rear face whose geometric shape and the layout of whose terminals 3b, 5b are substantially identical to that of a functional circuit breaker 20.

Preferably, each monitoring cable 40, 50 linked at the level of the terminals 3a, 5a to a circuit breaker 20 comprises a connection point 21a, 22a defined by an identification number making it possible to associate the functional circuit breaker 20 with the device to which it is linked. Thus, each connection point 21a, 22a of a monitoring cable 40, 50 is identified by an identification number. The false circuit breakers 30 not being associated with a device, a provisional identification number is allocated to each connection point 31b, 32b of the monitoring cables 40, 50 linked at the level of the terminals 3b, 5b to the false circuit breakers 30.

Figure 1:
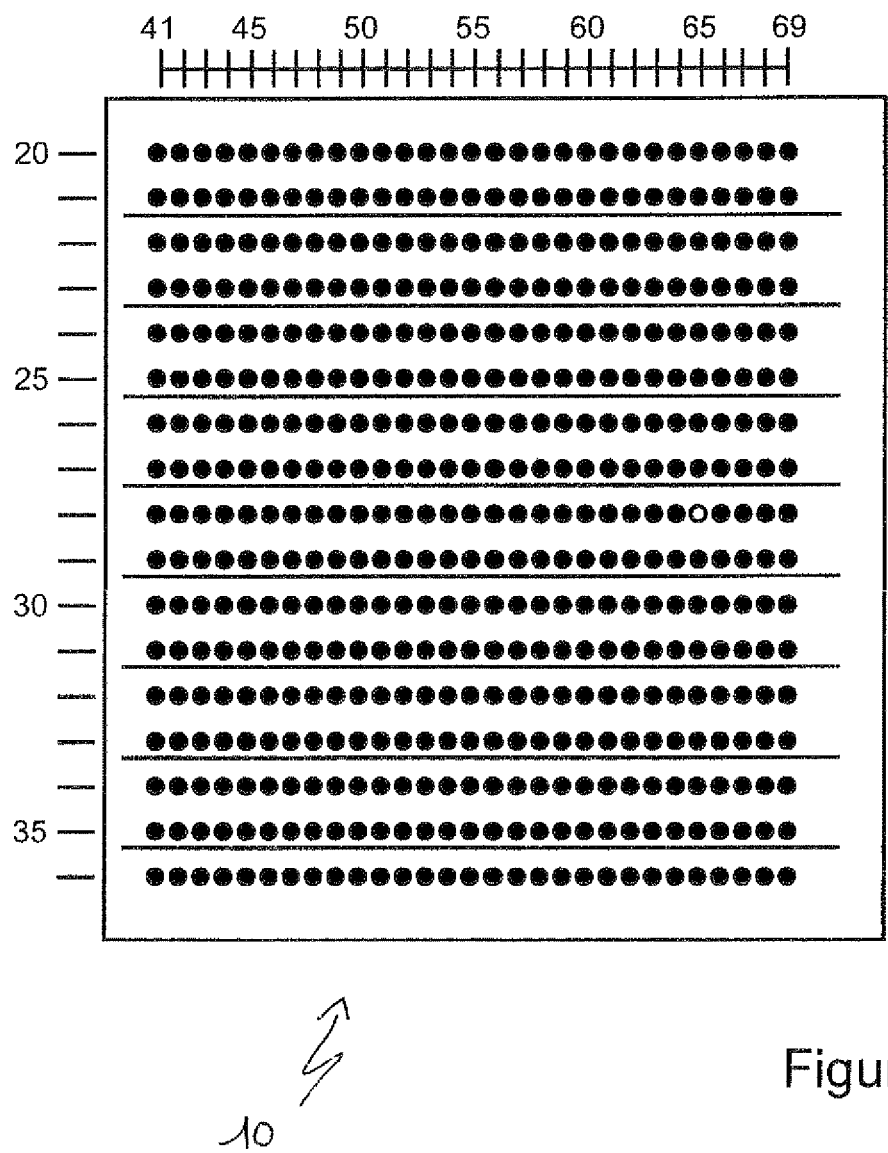
FIG. 1, a schematic view of a front face of a distribution panel.

In an exemplary embodiment, the distribution panel 10 comprising coordinates in terms of abscissa and ordinate serving to define the position of each site of the circuit breaker, the identification number of the is connection points 31b, 32b of the monitoring cables linked to the terminals 3b, 5b of a false circuit breaker 30 is advantageously defined by the coordinates of the site of the said false circuit breaker in the row-column matrix of the distribution panel 10. By way of illustration, in the distribution panel 10 of FIG. 1, the rows are numbered from 20 to 36 and the columns from 41 to 69. If a false circuit breaker 30 is positioned at the site situated in the 28th row and in the 65th column, the identification number allocated to this false circuit breaker 30 is then 2865.

Thus, the monitoring cabling may be defined without knowing the position of the functional circuit breakers 20 which will subsequently be installed.

Furthermore, at the level of each connection point 31b, 32b, each monitoring cable 40, 50 comprises an identification number which will then be reassigned during the installation of a functional circuit breaker 20 at the site of a false circuit breaker 30, without it being necessary to define and to install a new monitoring cable 40, 50.

Consequently, cabling for the state monitoring of the circuit breakers for all the sites on the distribution panels 10, makes it possible to obtain identical panels for a given aircraft model and the addition or the removal of functional circuit breakers 20 is then carried out without modification of the said monitoring cabling for the distribution panel 10.

When a functional circuit breaker 20 has to be added because of the installation of a new device, a first step consists, during the design of the modification, in renaming the identification number of the points of connection of the monitoring cables 40, 50 as a function of the device attached to the functional circuit breaker 20.

In a second step, the monitoring cables 40,50 are detached from the terminals 3*b*, 5*b* of the false circuit breaker 30 situated at the site that is to be occupied by the functional circuit breaker 20 to be installed. The false circuit breaker 30 is thereafter replaced with the functional circuit breaker 20 of the appropriate rating. The points of connection of the electrical monitoring cables, previously placed on standby at the level of the terminals 3*b*, 5*b* of the false circuit breaker 30, are recoupled respectively at the level of the terminals 3*a*, 5*a*. In a third step, in order to render operational the detection of the state of the new circuit breaker, all the elements of the monitoring system which check the state of the circuit breakers are updated, as a function of the new definition of the distribution panel 10.

The invention claimed is:

1. Electrical distribution panel of an aircraft, comprising:
   a plurality of sites arranged in a matrix by row and column, with each site configured to receive a circuit breaker;
   a plurality of functional circuit breakers for protecting an electrical device;
   at least one false circuit breaker for delivering a constant state signal, and not associated with an electrical device, wherein the at least one false circuit breaker is at a site located in a row of the plurality of sites in which one site of the row contains a first functional circuit breaker and in a column of the plurality of sites in which one site of the column contains a second functional circuit breaker;
   power supply cabling for connecting to a power supply, wherein the power supply cabling is wired to each of the plurality of functional circuit breakers and not to the at least one false circuit breaker; and
   first and second monitoring cabling for connecting to a monitoring system, wherein the first monitoring cabling links together, in series, terminals of the at least one false circuit breaker and the first functional circuit breaker, and the second monitoring cabling links together, in series, terminals of the at least one false circuit breaker and the second functional circuit breaker,
   wherein the false circuit breaker comprises a selector for determining the state signal delivered by the false circuit breaker.

2. Distribution panel in accordance with claim 1, wherein the false circuit breaker comprises terminals for receiving the first and second monitoring cabling and arranged geometrically in a manner substantially identical to terminals of the at least one functional circuit breaker.

3. Distribution panel in accordance with claim 1, wherein the state signal delivered by the false circuit breaker corresponds to at least one state signal delivered by the functional circuit breaker.

4. Distribution panel in accordance with claim 3, wherein the state signal delivered by the false circuit breaker is enabled or disabled.

5. Distribution panel in accordance with claim 1, wherein the state signal delivered by the false circuit breaker corresponds to a signal different from that delivered by the functional circuit breaker.

6. Distribution panel in accordance with claim 1, wherein the selector is an on/off switch with two states, enabled or disabled.

7. Distribution panel in accordance with claim 1, wherein the first and second monitoring cables are identified at the false circuit breaker by a provisional identification number.

8. Distribution panel in accordance with claim 7, wherein the provisional identification number is defined by a row-wise and column-wise position of the false circuit breaker.

* * * * *